(12) United States Patent
Kao et al.

(10) Patent No.: US 8,953,298 B2
(45) Date of Patent: Feb. 10, 2015

(54) ELECTROSTATIC CHUCK ROBOTIC SYSTEM

(75) Inventors: Chung-En Kao, Toufen Township (TW);
You-Hua Chou, Taipei (TW);
Chih-Tsung Lee, Hsinchu (TW);
Ming-Shiou Kuo, Taichung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 405 days.

(21) Appl. No.: 13/307,089

(22) Filed: Nov. 30, 2011

(65) Prior Publication Data

US 2013/0135784 A1    May 30, 2013

(51) Int. Cl.
*H01L 21/683*    (2006.01)
*H01T 23/00*    (2006.01)

(52) U.S. Cl.
USPC .......................................................... 361/234

(58) Field of Classification Search
CPC ...................... H01L 21/67742; H01L 21/6831
USPC .......................................................... 361/234
See application file for complete search history.

(56) References Cited

U.S. PATENT DOCUMENTS

| | | | | |
|---|---|---|---|---|
| 5,080,549 A | * | 1/1992 | Goodwin et al. | 414/744.8 |
| 5,291,538 A | * | 3/1994 | Burke et al. | 378/135 |
| 5,712,552 A | * | 1/1998 | Hirai et al. | 318/568.1 |
| 6,099,238 A | | 8/2000 | Tsubota | |
| 6,218,924 B1 | * | 4/2001 | Zabler et al. | 336/120 |
| 2004/0012471 A1 | | 1/2004 | Kojima et al. | |
| 2010/0104403 A1 | * | 4/2010 | Cho et al. | 414/222.13 |

FOREIGN PATENT DOCUMENTS

| JP | H10329059 A | 12/1998 |
|---|---|---|
| JP | H11135599 A | 5/1999 |
| JP | 2002280239 A | 9/2002 |

\* cited by examiner

*Primary Examiner* — Jared Fureman
*Assistant Examiner* — Lucy Thomas
(74) *Attorney, Agent, or Firm* — Eschweiler & Associates, LLC

(57) ABSTRACT

A workpiece transfer system has a plurality of joints having a bearing and a primary and secondary transformer coil, wherein power provided to the primary transformer coil and secondary transformer coil of each joint produces mutual inductance between the primary and secondary transformer coil of the respective joint. A first pair of arms are rotatably coupled to a blade by a first pair of the joints, wherein the primary transformer coil of each of the first pair of joints is operably coupled to the first pair of arms, and the secondary transformer coil of each of the first pair of joints is operably coupled to the blade and an electrode beneath a dielectric workpiece retaining surface of the blade. The electrode is contactlessly energized through the transformer coils of the joint and the blade can chuck and de-chuck a workpiece by reversing current directions and by voltage adjustment.

20 Claims, 3 Drawing Sheets

ELECTROSTATIC CHUCK ROBOTIC SYSTEM

BACKGROUND

In the manufacture of semiconductor devices, robots are often utilized to transfer a workpiece, such as a silicon wafer, between varying processing apparatuses. In some system architectures, a workpiece carrier is mounted to an arm of the robot, wherein the workpiece carrier is configured to transport the workpiece between the processing apparatuses.

One common workpiece carrier comprises a robot blade coupled to an end of the robot, wherein the workpiece rests on the workpiece blade during transportation thereof by the robot. Typically, gravity maintains the position of the workpiece with respect to the robot blade. As such, inertial forces of the workpiece with respect to the robot blade tend to limit a speed of travel of the robot blade. Accordingly, a vacuum source has been introduced on the robot arm, wherein the robot blade utilizes the vacuum source to maintain the position of the workpiece relative to the robot blade. For example, the vacuum source is plumbed to the robot blade in order to selectively provide a vacuum to an interface between the workpiece and the robot blade, therein selectively fixing the position of the workpiece with respect to the robot blade.

Such vacuum sources, however, often complicate a structure of the robot, wherein vacuum lines and associated structures add weight and cost to the robot, and potentially limit a motion of the robot blade.

SUMMARY

The following presents a simplified summary in order to provide a basic understanding of one or more aspects of the disclosure. This summary is not an extensive overview of the disclosure, and is neither intended to identify key or critical elements of the invention, nor to delineate the scope thereof. Rather, the primary purpose of the summary is to present some concepts of the disclosure in a simplified form as a prelude to the more detailed description that is presented later.

In one embodiment, the present disclosure relates to a workpiece transfer system, wherein the workpiece transfer system, such as a robotic system, comprises a blade for selectively retaining or holding a workpiece. The blade, for example, comprises one or more electrodes associated with a dielectric workpiece retaining surface, wherein a voltage applied to the one or more electrodes is configured to electrostatically attract a workpiece, such as a semiconductor wafer, to the dielectric workpiece retaining surface.

A plurality of joints is further provided, wherein each of the plurality of joints comprises a bearing, a primary transformer coil, and a secondary transformer coil. The bearing of each joint rotatably couples the primary transformer coil to the secondary transformer coil of the respective joint. Electrical power or voltage provided to one of the primary transformer coil and secondary transformer coil of each joint, for example, produces mutual inductance between the primary transformer coil and secondary transformer coil of the respective joint, therein providing contactless power across each joint.

According to one particular example, a first pair of arms is respectively rotatably coupled to the blade via a first pair of the plurality of joints. The primary transformer coil of each of the first pair of the plurality of joints, for example, is operably coupled to the respective first pair of arms, and the secondary transformer coil of each of the first pair of the plurality of joints is operably coupled to the blade. Thus, the first pair of arms is electrically, yet contactlessly, connected to the one or more electrodes.

In one particular, example, the primary transformer coil of each joint is generally ring-shaped and defines an outer coil having a hole therethrough, and the secondary transformer coil of each joint is generally rod-shaped and defines an inner coil configured to rotate within the outer coil. The bearing generally resides between the outer coil and the inner coil of each joint. Alternatively, the primary transformer coil of each joint is generally rod-shaped and defines the inner coil, and the secondary transformer coil of each joint is generally ring-shaped and defines the outer coil having a hole therethrough and is configured to rotate around the inner coil.

According to another example, a power source and a controller are provided, wherein the controller is configured to selectively energize the one or more electrodes by activating the power source. A mutual inductance between the primary transformer coil and secondary transformer coil of each joint provides contactless power through each joint from the power source to the one or more electrodes, therein selectively electrostatically charging the dielectric workpiece retaining surface. The controller, for example, is configured to switch a polarity of the power from the power source, therein selectively charging and discharging the dielectric workpiece retaining surface.

In another example, a second pair of arms is respectively rotatably coupled to the first pair of arms via a second pair of the plurality of joints. The primary transformer coil of each of the second pair of the plurality of joints is operably coupled to the respective second pair of arms, and the secondary transformer coil of each of the second pair of the plurality of joints is operably coupled to the respective first pair of arms. As such, again, contactless electrical connections through the joints are provided.

A robot base is further provided in another example, wherein the robot base is rotatably coupled to the second pair of arms via a third pair of the plurality of joints. The primary transformer coil of each of the third pair of the plurality of joints is operably coupled to the robot base, and the secondary transformer coil of each of the third pair of the plurality of joints is operably coupled to the respective second pair of arms, therein providing the contactless electrical connections through the joints.

The following description and annexed drawings set forth in detail certain illustrative aspects and implementations of the disclosure. These are indicative of but a few of the various ways in which the principles of the invention may be employed.

DETAILED DESCRIPTION

Figure 1:
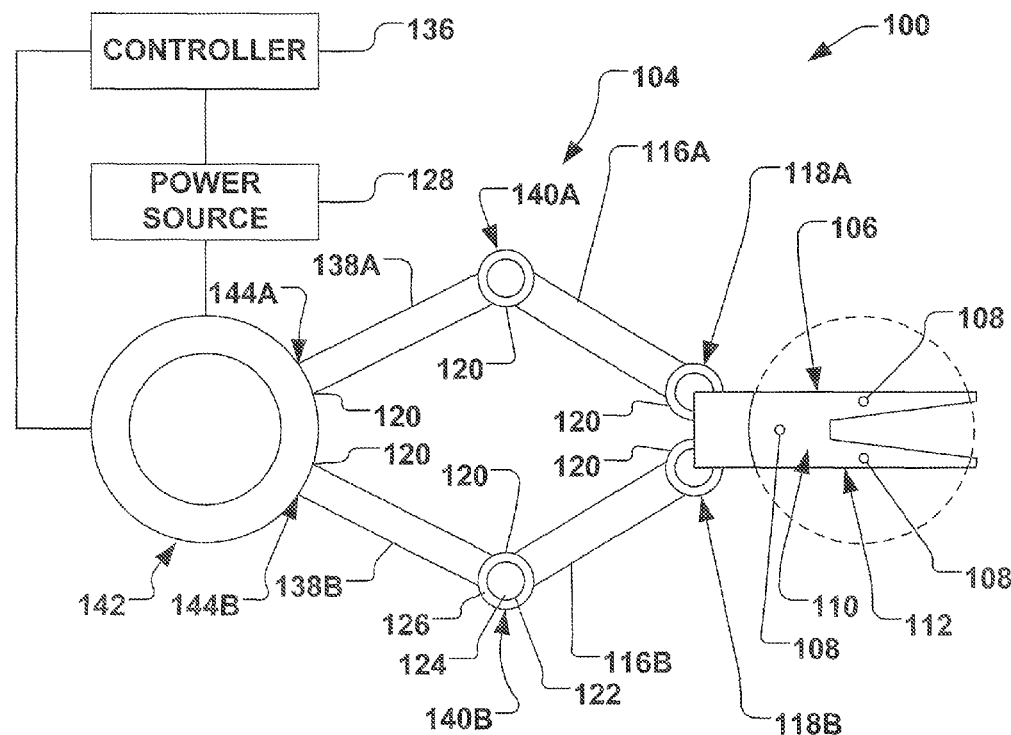
FIG. 1 illustrates a top view of one example of a workpiece transfer system according to one aspect of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Referring now to the Figures, FIG. 1 illustrates one aspect of the disclosure, wherein a workpiece transfer system 100 is provided. The workpiece transfer system 100, for example, is configured to selectively transfer a workpiece 102 from one location to another, such as between processing apparatuses (not shown). In one embodiment with the present disclosure, the workpiece transfer system 100 comprises a robot 104, as will be discussed hereafter.

Figure 2:
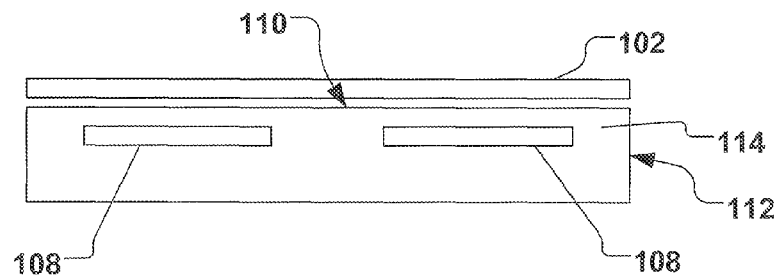
FIG. 2 illustrates a cross section of an exemplary electrostatic chuck according to another aspect of the disclosure.

The workpiece transfer system 100, for example, comprises a blade 106, wherein the blade is configured to selectively retain or hold the workpiece 102. The blade 106, in accordance with on exemplary aspect of the disclosure, comprises one or more electrodes 108 associated with a dielectric workpiece retaining surface 110. The one or more electrodes 108 and dielectric workpiece retaining surface 110 generally define an electrostatic chuck 112. As illustrated schematically in FIG. 2, the one or more electrodes 108 of the electrostatic chuck 112 are generally embedded in a dielectric layer 114 (e.g., a ceramic), wherein a voltage supplied to the one or more electrodes electrostatically attracts the workpiece 102 to the dielectric workpiece retaining surface 110.

In accordance with one exemplary aspect of the disclosure, the robot 104 comprises a first pair of arms 116A, 116B respectively rotatably coupled to the blade 106 via a first pair 118A, 118B of a plurality of joints 120. The plurality of joints 120, for example, each comprise a bearing 122, a primary transformer coil 124, and a secondary transformer coil 126, as illustrated in greater detail in FIGS. 3A and 3B. The bearing 122 of each joint 120 rotatably couples the primary transformer coil 124 to the secondary transformer coil 126 of the respective joint. In one example, power (e.g., voltage from a power source 128 of FIG. 1) provided to one of the primary transformer coil 124 and secondary transformer coil 126 of each joint 120 produces mutual inductance between the primary transformer coil and secondary transformer coil of the respective joint, therein providing contactless power across each joint.

Figure 3A:
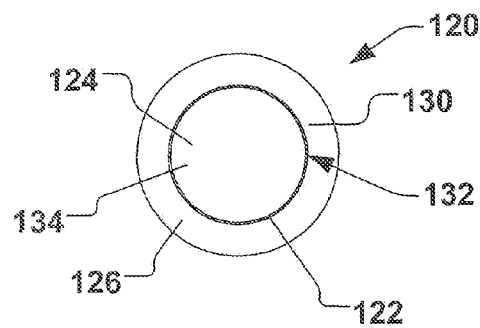
FIGS. 3A and 3B illustrate respective plan views of an exemplary joint according to yet another aspect of the disclosure.

In the example illustrated in FIG. 3A, the primary transformer coil 124 of each joint 120 is generally ring-shaped and defines an outer coil 130 having a hole 132 therethrough. In the present example, the secondary transformer coil 126 of each joint 120 is generally rod-shaped and defines an inner coil 134 configured to rotate within the outer coil 130, wherein the bearing 122 generally resides between the outer coil and the inner coil of each joint and enables free rotation thereof. The bearing 122, for example, may be greaseless in order to limit contamination associated therewith.

Figure 3B:
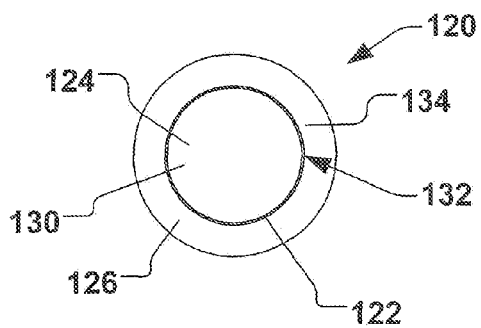

In another example, as illustrated in FIG. 3B, the primary transformer coil 124 of each joint 120 is generally rod-shaped and defines the inner coil 130, and the secondary transformer coil 126 is generally ring-shaped and defines the outer coil 134 configured to rotate about the inner coil. Again, the bearing 122 generally resides between the outer coil 134 and the inner coil 130 of each joint and enables free rotation thereof. While the present example described rod-shaped and ring-shaped coils, it will be understood that various other architectures are possible and contemplated as falling within the scope of the present disclosure.

Figure 4:
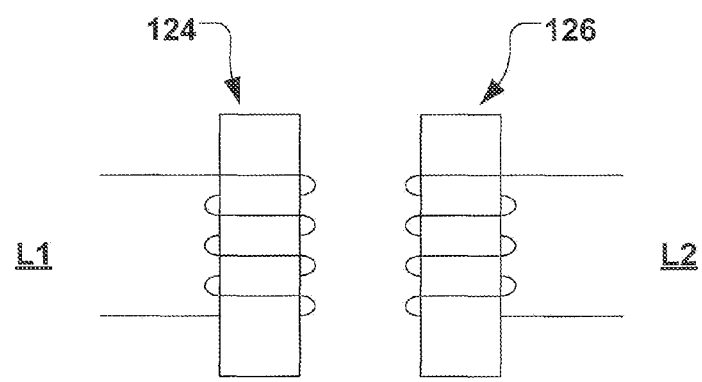
FIG. 4 illustrates a schematic of exemplary inductance coils according to still another aspect of the disclosure.

FIG. 4 conceptually illustrates the primary transformer coil 124 (also called a primary inductor) and secondary transformer coil 126 (also called a secondary inductor), wherein L1 represents the inductance of the primary transformer coil 124 and L2 represents the inductance of the secondary transformer coil 126. Mutual inductance M occurs when the change in current in one inductor induces a voltage in another nearby inductor. The mutual inductance M is also a measure of the coupling between two inductors. The mutual inductance M has the relationship:

$$M_{21}=N_1N_2P_{21} \quad (1)$$

where $M_{21}$ is the mutual inductance, and the subscript specifies the relationship of the voltage induced in the secondary transformer coil 126 due to a current in the primary transformer coil 124. $N_1$ is the number of turns in the primary transformer coil 124, $N_2$ is the number of turns in secondary transformer coil 126, and $P_{21}$ is the permeance of the space occupied by the flux.

When one inductor is closely coupled to another inductor through mutual inductance, such as in a transformer, the voltages, currents, and number of turns can be related in the following way:

$$V_S=(N_S/N_P)V_P \quad (2)$$

where $V_S$ is the voltage across the secondary transformer coil 126, $V_P$ is the voltage across the primary transformer coil 124 (e.g., connected to the power source 128), $N_S$ is the number of turns in the secondary transformer coil 126, and $N_P$ is the number of turns in the primary transformer coil 124.

Referring again to FIG. 1, the first pair of arms 116A, 116B, for example, generally permit the blade 106 to rotate with respect to the first pair of arms. The primary transformer coil 124 of each of the first pair 118A, 118B of the plurality of joints 120 is operably coupled to the respective first pair of arms 116A, 116B, and the secondary transformer coil 126 of each of the first pair of the plurality of joints is operably coupled to the blade 106. Accordingly, the one or more electrodes 108 are electrically coupled in a contactless manner to the first pair of arms 116A, 116B.

The workpiece transfer system 100, as illustrated in FIG. 1, for example, further comprises a controller 136, wherein the controller is configured to selectively energize the one or more electrodes 108 by selectively activating the power source 128. Thus, the mutual inductance between the primary transformer coil 124 and secondary transformer coil 126 of each joint 120 provides contactless power through each joint from the power source 128 to the one or more electrodes 108, therein selectively electrostatically charging the dielectric workpiece retaining surface 110 of the electrostatic chuck 112. The controller 136, for example, is further configured to switch a polarity of the power from the power source 128 (e.g., from positive to negative DC voltage), therein selectively charging and discharging the dielectric workpiece retaining surface 110.

In accordance with another example, the robot 104 of the workpiece transfer system 100, further comprises a second pair of arms 138A, 138B respectively rotatably coupled to the first pair of arms 116A, 116B, via a second pair 140A, 140B of the plurality of joints 120. Accordingly, the primary transformer coil 124 of each of the second pair 140A, 140B of the plurality of joints 120 is operably coupled to the respective second pair of arms 138A, 138B, and the secondary transformer coil 126 of each of the second pair of the plurality of joints is operably coupled to the respective first pair of arms 116A, 116B.

According to another example, the robot 104 further comprises a robot base 142 rotatably coupled to the second pair of arms 138A, 138B via a third pair 144A, 144B of the plurality of joints 120. The primary transformer coil 124 of each of the third pair 144A, 144B of the plurality of joints 120 is thus operably coupled to the robot base 142, and the secondary transformer coil 126 of each of the third pair of the plurality of joints is operably coupled to the respective second pair of arms 138A, 138B. Thus, again, the mutual inductance between the primary transformer coils 124 and secondary transformer coils 126 of each joint 120 provides contactless power through each joint from the power source 128 to the one or more electrodes 108, therein selectively electrostatically charging the dielectric workpiece retaining surface 110 of the electrostatic chuck 112.

Figure 5:
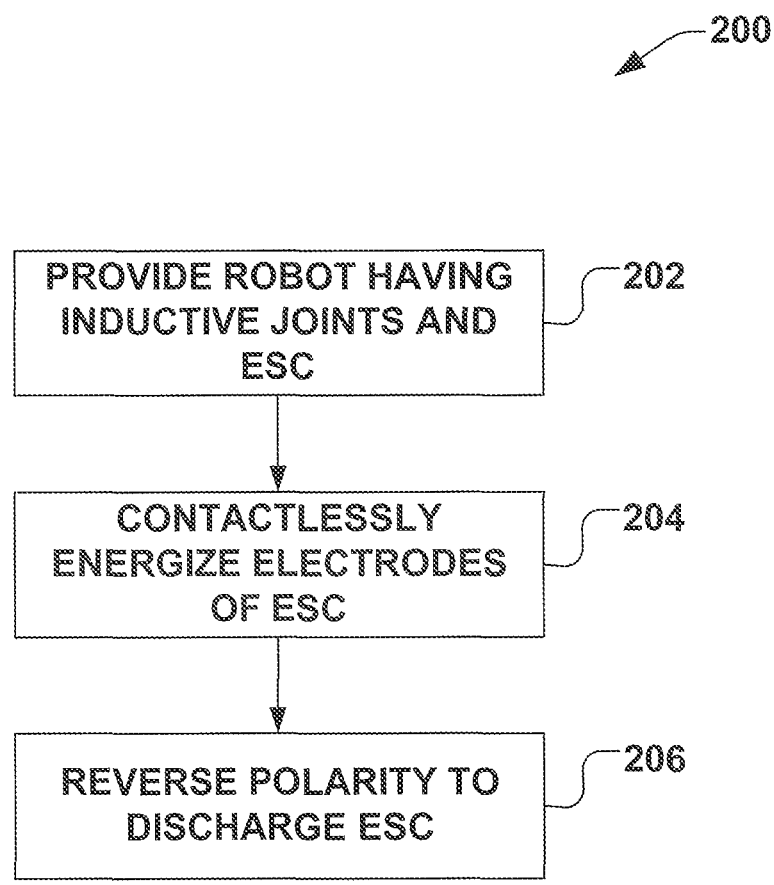
FIG. 5 illustrates a flow diagram of a method for selectively retaining a workpiece on in a workpiece transfer system according to another exemplary aspect of the disclosure.

FIG. 5 illustrates another example embodiment of a method 200 for selectively retaining a workpiece. While the method 200 provided herein is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

As illustrated at act 202 of FIG. 5, the method 200 begins by providing a blade that is rotatably coupled to a robot arm via a joint comprising a primary transformer coil, a secondary transformer coil and a bearing disposed therebetween, such as the robot 104 illustrated in FIG. 1. According to the method, the blade has a dielectric workpiece retaining surface and one or more electrodes disposed below the dielectric workpiece retaining surface, such as illustrated in the electrostatic chuck 112 of FIG. 2.

In act 204, power is provided to the primary transfer coil at a predetermined polarity, therein contactlessly energizing the one or more electrodes via mutual inductance between a respective primary and secondary transformer coils of the joint. Accordingly, a workpiece is electrostatically attracted to the dielectric workpiece retaining surface.

In act 206, the polarity of the power provided to the primary transformer coil is reversed, therein discharging the dielectric workpiece retaining surface, and permitting the workpiece to be removed from the dielectric workpiece retaining surface.

It will be appreciated that while reference is made throughout this document to exemplary structures in discussing aspects of methodologies described herein, those methodologies are not to be limited by the corresponding structures presented. Rather, the methodologies (and structures) are to be considered independent of one another and able to stand alone and be practiced without regard to any of the particular aspects depicted in the Figures. Additionally, layers described herein can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A workpiece transfer system, comprising:
    a blade, wherein the blade comprises one or more electrodes associated with a dielectric workpiece retaining surface;
    a plurality of joints, each of the plurality of joints comprising a bearing, a primary transformer coil, and a secondary transformer coil, wherein the bearing of each joint rotatably couples the primary transformer coil to the secondary transformer coil of the respective joint, and wherein power provided to one of the primary transformer coil and secondary transformer coil of each joint produces mutual inductance between the primary transformer coil and secondary transformer coil of the respective joint, therein providing contactless power across each joint, wherein the primary transformer coil of each joint is ring-shaped and defines an outer coil having a hole therethrough, and wherein the secondary transformer coil of each joint is rod-shaped and defines an inner coil configured to rotate within the outer coil, and wherein the bearing resides between the outer coil and the inner coil of each joint; and
    a first pair of arms respectively rotatably coupled to the blade via a first pair of the plurality of joints, wherein the primary transformer coil of each of the first pair of the plurality of joints is operably coupled to the respective first pair of arms, and wherein the secondary transformer coil of each of the first pair of the plurality of joints is operably coupled to the blade and is electrically connected to the one or more electrodes.

2. The workpiece transfer system of claim 1, wherein the bearing of each joint comprises a greaseless bearing.

3. The workpiece transfer system of claim 1, further comprising a power source and a controller, wherein the controller is configured to selectively energize the one or more electrodes by activating the power source, wherein mutual inductance between the primary transformer coil and secondary transformer coil of each joint provides contactless power through each joint from the power source to the one or more electrodes, therein selectively electrostatically charging the dielectric workpiece retaining surface.

4. The workpiece transfer system of claim 3, wherein the controller is configured to switch a polarity of the power from the power source, therein selectively charging and discharging the dielectric workpiece retaining surface.

5. The workpiece transfer system of claim 1, further comprising a second pair of arms respectively rotatably coupled to the first pair of arms via a second pair of the plurality of joints, wherein the primary transformer coil of each of the second pair of the plurality of joints is operably coupled to the respective second pair of arms, and wherein the secondary transformer coil of each of the second pair of the plurality of joints is operably coupled to the respective first pair of arms.

6. The workpiece transfer system of claim 5, further comprising a robot base rotatably coupled to the second pair of arms via a third pair of the plurality of joints, wherein the primary transformer coil of each of the third pair of the plurality of joints is operably coupled to the robot base, and wherein the secondary transformer coil of each of the third pair of the plurality of joints is operably coupled to the respective second pair of arms.

7. The workpiece transfer system of claim 1, wherein the one or more electrodes are disposed below the dielectric workpiece retaining surface.

8. A workpiece transfer system, comprising:
a blade, wherein the blade comprises one or more electrodes associated with a dielectric workpiece retaining surface;
a plurality of joints, each of the plurality of joints comprising a bearing, a primary transformer coil, and a secondary transformer coil, wherein the bearing of each joint rotatably couples the primary transformer coil to the secondary transformer coil of the respective joint, and wherein power provided to one of the primary transformer coil and secondary transformer coil of each joint produces mutual inductance between the primary transformer coil and secondary transformer coil of the respective joint, therein providing contactless power across each joint, wherein the primary transformer coil of each joint is rod-shaped and defines an inner coil, and wherein the secondary transformer coil of each joint is ring-shaped and defines an outer coil having a hole therethrough and is configured to rotate around the inner coil, and wherein the bearing resides between the outer coil and the inner coil of each joint; and
a first pair of arms respectively rotatably coupled to the blade via a first pair of the plurality of joints, wherein the primary transformer coil of each of the first pair of the plurality of joints is operably coupled to the respective first pair of arms, and wherein the secondary transformer coil of each of the first pair of the plurality of joints is operably coupled to the blade and is electrically connected to the one or more electrodes.

9. The workpiece transfer system of claim 8, wherein the bearing of each joint comprises a greaseless bearing.

10. The workpiece transfer system of claim 8, further comprising a power source and a controller, wherein the controller is configured to selectively energize the one or more electrodes by activating the power source, wherein mutual inductance between the primary transformer coil and secondary transformer coil of each joint provides contactless power through each joint from the power source to the one or more electrodes, therein selectively electrostatically charging the dielectric workpiece retaining surface.

11. The workpiece transfer system of claim 10, wherein the controller is configured to switch a polarity of the power from the power source, therein selectively charging and discharging the dielectric workpiece retaining surface.

12. The workpiece transfer system of claim 8, further comprising a second pair of arms respectively rotatably coupled to the first pair of arms via a second pair of the plurality of joints, wherein the primary transformer coil of each of the second pair of the plurality of joints is operably coupled to the respective second pair of arms, and wherein the secondary transformer coil of each of the second pair of the plurality of joints is operably coupled to the respective first pair of arms.

13. The workpiece transfer system of claim 12, further comprising a robot base rotatably coupled to the second pair of arms via a third pair of the plurality of joints, wherein the primary transformer coil of each of the third pair of the plurality of joints is operably coupled to the robot base, and wherein the secondary transformer coil of each of the third pair of the plurality of joints is operably coupled to the respective second pair of arms.

14. The workpiece transfer system of claim 8, wherein the one or more electrodes are disposed below the dielectric workpiece retaining surface.

15. A workpiece transfer system, comprising:
a power source;
a blade having a dielectric workpiece retaining surface configured to selectively retain a workpiece, wherein the blade comprises one or more electrodes associated with the dielectric workpiece retaining surface;
a plurality of joints, each of the plurality of joints comprising a bearing, a primary transformer coil, and a secondary transformer coil, wherein the bearing of each joint rotatably couples the primary transformer coil to the secondary transformer coil of the respective joint, and wherein power provided to one of the primary transformer coil and secondary transformer coil of each joint produces mutual inductance between the primary transformer coil and secondary transformer coil of the respective joint, therein providing contactless power across each joint, wherein the primary transformer coil of each joint is ring-shaped and defines an outer coil having a hole therethrough, and wherein the secondary transformer coil of each joint is rod-shaped and defines an inner coil configured to rotate within the outer coil, and wherein the bearing resides between the outer coil and the inner coil of each joint;
a first pair of arms respectively rotatably coupled to the blade via a first pair of the plurality of joints, wherein the primary transformer coil of each of the first pair of the plurality of joints is operably coupled to the respective first pair of arms and electrically coupled to power source through the respective first pair of arms, and wherein the secondary transformer coil of each of the first pair of the plurality of joints is operably coupled to the blade and is electrically connected to the one or more electrodes; and
a controller, wherein the controller is configured to selectively energize the one or more electrodes by activating the power source, wherein mutual inductance between the primary transformer coil of the first pair of the plurality of joints and the secondary transformer coil of the first pair of the plurality of joints provides contactless power through the first pair of the plurality of joints from the power source to the one or more electrodes.

16. The workpiece transfer system of claim 15, wherein bearing of each joint comprises a greaseless bearing.

17. The workpiece transfer system of claim 15, wherein the controller is configured to switch a polarity of the power from the power source, therein selectively charging and discharging the dielectric workpiece retaining surface.

18. The workpiece transfer system of claim 15, further comprising a second pair of arms respectively rotatably coupled to the first pair of arms via a second pair of the plurality of joints, wherein the primary transformer coil of each of the second pair of the plurality of joints is operably coupled to the respective second pair of arms, and wherein the secondary transformer coil of each of the second pair of the plurality of joints is operably coupled to the respective first pair of arms.

19. The workpiece transfer system of claim 18, further comprising a robot base rotatably coupled to the second pair of arms via a third pair of the plurality of joints, wherein the primary transformer coil of each of the third pair of the plurality of joints is operably coupled to the robot base, and wherein the secondary transformer coil of each of the third pair of the plurality of joints is operably coupled to the respective second pair of arms.

20. The workpiece transfer system of claim 15, wherein the one or more electrodes are disposed below the dielectric workpiece retaining surface.

* * * * *